United States Patent [19]
Lohrmann

[11] 3,857,099
[45] Dec. 24, 1974

[54] MIXER FOR CONTROLLING THE FREQUENCY ACCURACY OF A VARIABLE FREQUENCY OSCILLATOR

[75] Inventor: Dieter R. Lohrmann, Eatontown, N.J.

[73] Assignee: The United States of American as represented by the Secretary of the Army, Washington, D.C.

[22] Filed: May 8, 1973

[21] Appl. No.: 358,423

[52] U.S. Cl. .................... 325/436, 325/421, 331/19
[51] Int. Cl. ............................................ H04b 1/26
[58] Field of Search .............................. 325/17–22, 325/436, 442, 446, 451, 49, 50, 329, 330, 419, 421, 184; 343/180, 181; 328/13, 23; 332/46; 331/19

[56] References Cited

UNITED STATES PATENTS

| | | | |
|---|---|---|---|
| 3,132,310 | 5/1964 | Harrison | 331/19 |
| 3,155,970 | 11/1964 | Vladimir | 325/18 |
| 3,427,561 | 2/1969 | Hamer | 331/19 |

*Primary Examiner*—Robert L. Griffin
*Assistant Examiner*—George H. Libman
*Attorney, Agent, or Firm*—Eugene E. Stevens, III; Frank J. Dynda; Arthur L. Bowers

[57] ABSTRACT

A mixer for a frequency synthesizer system that controls the frequency accuracy of a variable frequency oscillator of a radio transmitter and which includes a balanced amplifier that is nonconductive except when switched on by each of identical periodic impulses shaped to include a predetermined number of successive harmonics from the fundamental on, all having approximately equal amplitude, and a selected frequency input from the variable frequency oscillator to the balanced amplifier so that the mixer output includes a predetermined narrow frequency band that is less than said fundamental.

6 Claims, 7 Drawing Figures

MIXER FOR CONTROLLING THE FREQUENCY ACCURACY OF A VARIABLE FREQUENCY OSCILLATOR

BACKGROUND OF THE INVENTION

This invention relates to an improvement in receiver-transmitter radio set AN/PRC-77 described in Department of the Army technical manual TM11-5820-667-35, dated February 1968. The technical manual is a printed publication, not under restriction. The radio set is tunable in 50KHz increments over a frequency range of 30.00MHz to 75.95MHz. The frequency range is covered in two bands; the lower band is 30.00MHz to 52.95MHz; the higher band is 53.00MHz to 75.95MHz. In the equipment the output of the first mixer of the frequency synthesizer system is a narrow band centered around 53MHz. Problems of false lock and no lock in transmit around 53MHz had beset the equipment.

SUMMARY OF THE INVENTION

The radio set AN/PRC-77 includes a variable frequency oscillator connected in a closed loop with a frequency synchronizer system for locking the variable frequency oscillator accurately on frequency. This invention concerns a modification in the frequency synthesizer, i.e. a novel mixer arrangement that provides higher level output in the radio set than mixer circuitry that had been used in the radio set. The novel mixer helped eliminate real and potential false or no lock problems of the synthesizer in transmit around 53MHz. Also, with the invention, the radio may stay keyed while frequency is changed, without false lock, which was not possible previously. The application of the novel mixer is not limited to the AN/PRC-77.

DESCRIPTION OF THE PREFERRED EMBODIMENT

Figure 1:
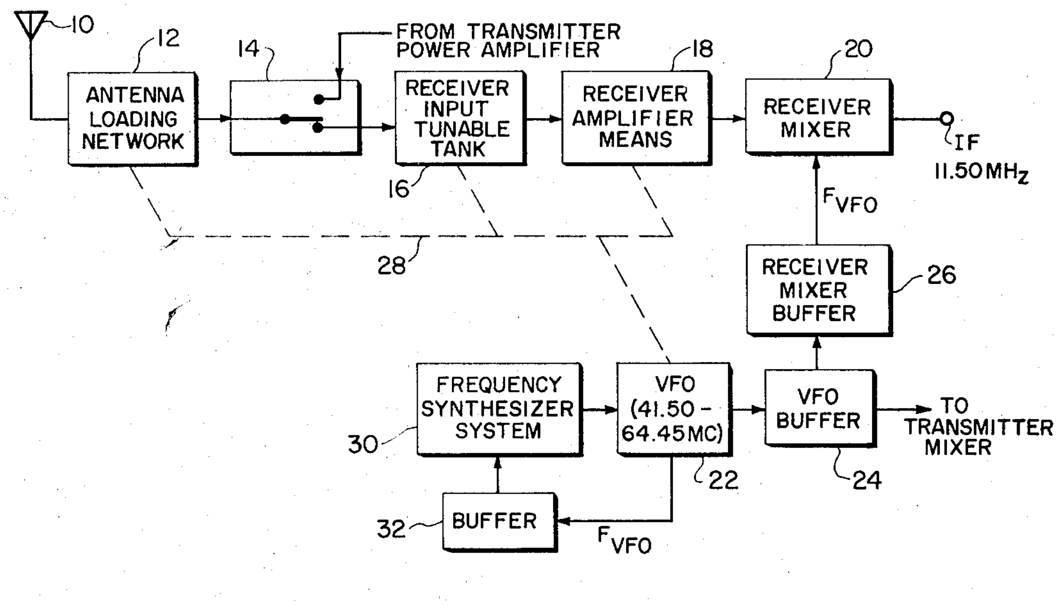
FIG. 1 PRIOR ART
FIG. 1 is a block diagram of part of radio set AN/PRC-77, an equipment for utilizing a preferred embodiment of the invention.

The AN/PRC-77 radio set circuit, as shown in part in the block diagram of FIG. 1, includes an antenna means 10, a tunable antenna loading network 12 for matching the antenna to the circuit input impedance over the tuning range and a switching device 14 for connecting the antenna loading network to the input of the receiver as shown in FIG. 1 or to the output of the transmitter power amplifier, indicated by legend but not shown. At the receiver input is a tunable tank circuit 16, tunable across the selected one of the two end-to-end bands, viz. 30–52.95MHz and 53–75.95MHz respectively. Tunable radio frequency (RF) amplifier means 18 are connected to the output of the tunable tank 16. A band switch, not shown, is operable to set the tank and amplifier circuits to the lower band 30.00MHz–52.95MHz or to the higher band 53.00MHz to 75.95MHz. The output of the RF amplifier means 18 is delivered to receiver mixer 20.

A variable frequency oscillator (VFO) 22, tunable in 50KHz steps from 41.50MHz to 64.45MHz provides its output to a VFO buffer 24 which delivers the VFO output frequency to a transmitter mixer, indicated by legend but not shown, and to receiver mixer buffer 26 for delivery to the receiver mixer 20. The receiver mixer heterodynes the RF from amplifier means 18 and the VFO frequency to produce the intermediate frequency (IF) band centered about 11.50MHz. Ganged tuning means indicated by broken lines 28 are provided for the antenna loading network, receiver input tunable tank, the RF amplifier means, and the VFO. When the band switch, not shown, selects the lower band, the VFO is set to operate at 11.50MHz above the signal carrier frequency. When the band switch selects the higher band, the VFO is set to operate at 11.50MHz below the signal carrier frequency.

A frequency synthesizer system (FSS) 30 is provided to lock the VFO on frequency, during reception and during transmission. The VFO is coupled to the FSS by buffer 32, together forming a loop. Automatic phase control voltage from the FSS locks the VFO on frequency.

Figure 2:
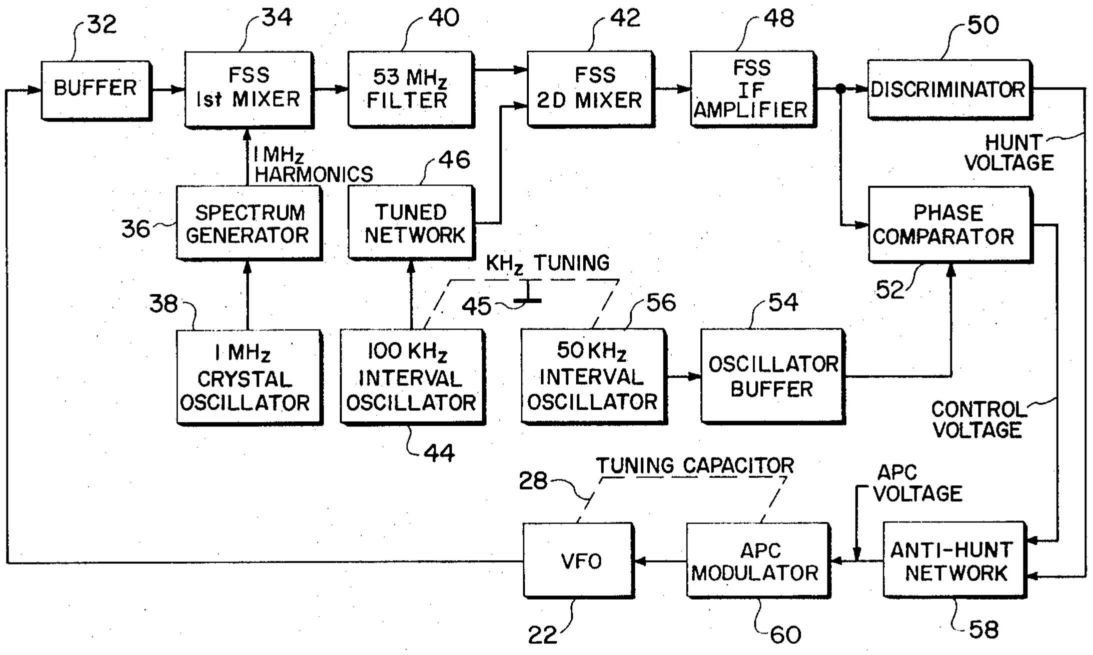
FIG. 2 PRIOR ART
FIG. 2 is a block diagram of the variable frequency oscillator and frequency synthesizer system (FSS) loop of radio set AN/PRC-77 including as first FSS mixer the improvement according to this invention.

FIG. 2 shows a more comprehensive block diagram of the VFO-FSS loop shown in FIG. 1. Buffer 32 transmits a portion of the VFO output to FSS first mixer 34. The buffer 32 isolates the VFO from the FSS first mixer 34 to prevent feedback of sidebands from the mixer. A spectrum generator 36 driven by the output of 1.0MHz crystal oscillator 38 delivers the other input to the FSS first mixer 34. The spectrum generator converts the sinusoidal output of the 1.0MHz crystal oscillator into pulses rich in harmonic content, i.e., a frequency spectrum ranging from 1 through 12MHz in 1.0MHz increments and of approximately equal amplitudes. The FSS first mixer 34 heterodynes the inputs and delivers a narrow band centered about 53MHz to the 53MHz filter 40. For example, when the VFO is operating at 44.60MHz, its sum with the eighth harmonic from the spectrum generator is 52.60MHz. The 53MHz filter 40 connected to the output of the FSS first mixer 34 passes a band of frequencies centered at 53MHz to FSS second mixer 42. A 100KHz interval oscillator 44, tunable between 46.85MHz–47.75MHz, in 100KHz increments, by means of a KHz tuning knob 45 and other mechanical elements represented by broken lines feeds a second input to FSS second mixer through tuned network 46, for reducing spurious frequencies. The FSS second mixer provides difference frequencies only which are fed to the FSS IF amplifier 48. With the KHz tuning knob set at the 0.95MHz or 0.00MHz point of the KHz dial, the 100KHz interval oscillator frequency will be 46.85MHz; at a 0.05MHz or 0.10MHz dial point, the frequency is 46.95MHz; at a 0.15MHz or 0.20MHz dial point, the frequency is 47.05MHz . . . ; at a 0.85MHz or 0.90MHz dial point, the frequency is 47.75MHz. The IF in the FSS is 5.65MHz at all the 100KHz dial points and 5.60MHz at the 50KHz dial points. The output of FSS IF amplifier 48 is delivered to the discriminator 50 and to the phase comparator 52. Oscillator buffer 54 transmits the output of 50KHz interval oscillator 56 to the other input of the phase comparator 52.

The 50KHz interval oscillator 56 generates either 5.60MHz, or 5.65MHz, depending on whether or not the frequency selected by the tuning knob 45 is a 50KHz or 100KHz dial point. When a 50KHz dial point is selected, the 50KHz interval oscillator output frequency is 5.65KHz and conversely, when a 100KHz dial point is selected, the 100KHz interval oscillator output frequency is 5.60MHz.

The output of the 50KHz interval oscillator is applied as a reference signal to the phase comparator. The phase of the two input signals, viz., the reference signal from the oscillator buffer and the output of FSS IF amplifier 48 are compared and a control voltage is developed in the phase comparator 52. The control voltage is added serially into the output or hunt voltage of the discriminator and the hunt voltage is applied through low pass filter 58 to the APC modulator. If a phase lock exists, the APC voltage assumes the reference level to maintain the VFO on frequency. If a phase difference exists, an error voltage is developed in the phase comparator. This error voltage varies the APC voltage applied to the APC modulator from the reference level to correct the operating frequency of the VFO.

Frequency discriminator 50 operates so that there exists in the loop a positive loop gain, viz., gain greater than one at a frequency of approximately 25Hz. In the absence of phase lock, the loop oscillates (hunts). When the frequency discriminator hunting loop hunts through the phase locking point, phase lock takes over reducing the loop gain below unity. Hunting stops automatically after the phase lock has taken over.

The radio set shown in FIGS. 1 and 2 had frequency accuracy problems. False lock and no lock interfered with successful operation. It was found that even if all adjustments were carried out very carefully, the set still had potential for false lock around 53MHz dial frequency, particularly if frequency were changed when or while the transmitter was keyed. Also, an exchange of modules in the field negated accurate adjustment. Malfunction is caused by leakage of 53MHz transmit signal in the 53Mhz filter 40. When the transmitter is keyed, the FSS hunts across the band until it finds the lock. If the amplitude of the 53MHz frequency component is about equal to or greater than the desired signal, the synthesizer may be jolted out of its lock and a false lock or no lock condition may occur. The same condition is encountered if for some reason the synthesizer still hunts for its lock when the transmitter comes on. The problems were resolved by substituting a novel mixer circuit shown in FIG. 3 for the FSS first mixer and spectrum generator of FIG. 2.

Figure 3:
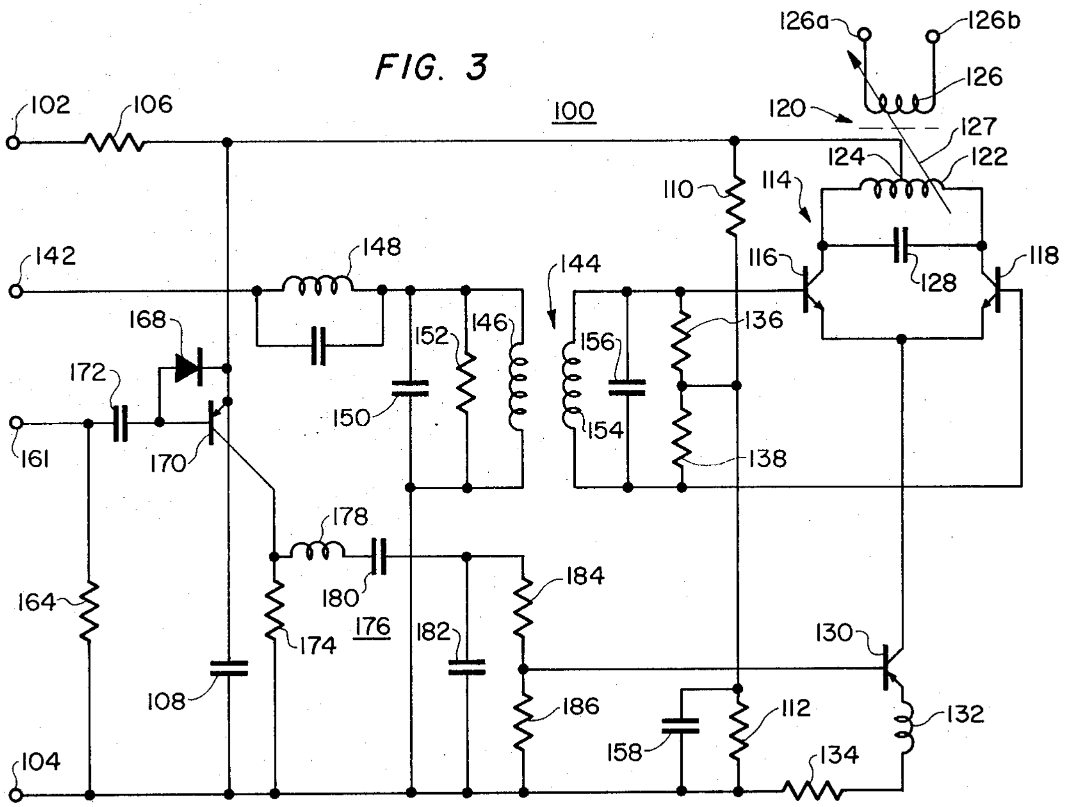
FIG. 3 is a preferred embodiment of an impulse mixer in accordance with this invention for the frequency synthesizer system shown in FIG. 2.

A mixer 100 incorporating the novel features of this invention, for replacing the FSS first mixer 34 and spectrum generator 36 is shown in detail in FIG. 3. The terminals 102 and 104 are connected to positive and negative terminals of a direct current source, not shown. A resistor 106 and a capacitor 108 are connected in series between terminals 102 and 104 for decoupling the mixer 100 and the direct current source. Series-connected resistors 110 and 112 are connected in parallel with capacitor 108 to function as a voltage divider. Mixer 100 includes a balanced amplifier 114 having a pair of NPN transistors 116, 118 and an output transformer 120. Output transformer 120 has a primary coil 122 with a center tap 124, and a secondary coil 126 with output terminals **126*a* and 126*b*; the primary is adjustable, as indicated by arrow 127. The center tap 124 of primary coil 122 is connected to the junction of decoupling resistor 106 and capacitor 108; the ends of the primary coil 122 are connected to the collectors of the transistors 116 and 118, respectively. A capacitor 128 is connected in parallel with the primary coil 122 to sharply tune the output to the selected frequency band, viz., about 2MHz bandwidth about 53MHz. The emitters of the transistors 116, 118 are connected in common and in series with NPN transistor 130 which is operable to switch the balanced amplifier on and off. The emitters of transistors 116, 118 are connected to the collector of transistor 130. An inductor 132 and a resistor 134 are connected in series between the emitter of transistor 130 and the negative or reference terminal 104. The inductor functions to reduce unwanted harmonics. There is no forward bias on the base of transistor 130; transistor 130** is nonconductive in the absence of positive switching impulses.

The transistors 116, 118 are forward biased for Class A operation by a pair of matched resistors 136, 138, accuracy within one percent, connected between the voltage divider junction 140 and the bases of the respective transistors 116 and 118. The selected frequency from the VFO is delivered to the terminal 142. A transformer 144 couples the selected frequency from VFO terminal 142 to the amplifier 114 and forms part of a band pass filter network. One end of the primary 146 of transformer 144 is connected to the reference terminal 104; a frequency trap 148 for blocking harmonics of the selected VFO output frequency is connected in series with the other end of the primary. A capacitor 150 is selected to tune the primary to cut off above 64MHz. A resistor 152 connected across the primary provides the required bandwidth for the frequency range of the VFO. Similarly, the secondary 154 is tuned by capacitor 156 to cut off above 64MHz and the resistors 136 and 138 provide the bandwidth. Resistors 136 and 138 provide more accurate balancing than would a center tap on secondary 154. A bypass capacitor 158 is connected across the resistor 112 to ground junction 140 with respect to RF.

Figures 4A, 4B, 4C, 4D:
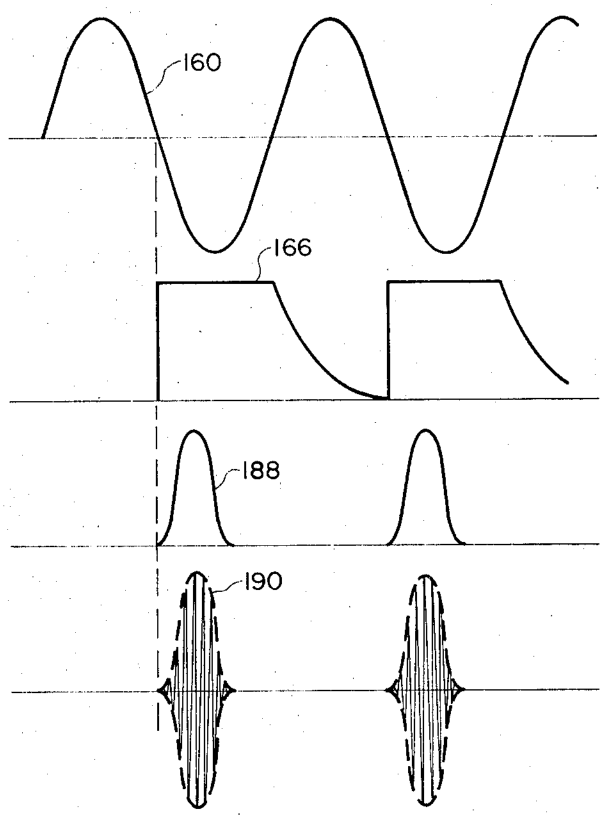
FIGS. 4A, 4B, 4C, 4D are X–Y plots along a common time base showing characteristics of the mixer of FIG. 3.

The crystal oscillator 38, not shown in FIG. 3, is connected between terminals 161 and 104 and applies sine wave 162, shown in FIG. 4A, across input resistor 164 connected between the terminals 161 and 104. Means for converting the sine wave 160 to an approximately rectangular wave 166 of the same period, shown in FIG. 4B, is coupled to the terminal 161. The converting means includes a diode 168 and a PNP transistor 170. The cathode of diode 168 and the emitter of transistor 170 are connected to the junction of power supply decoupling resistor 106, capacitor 108; a capacitor 172 couples the terminal 160 to the anode of diode 168 and the base of transistor 170. A load resistor 174 is connected between the collector of transistor 170 and the terminal 104. During each negative swing of the sine wave, the transistor 170 conducts; the voltage at the collector rises steeply to the voltage at the junction of resistor 106 and capacitor 108 and for essentially each entire negative half cycle of the sine wave 160, the voltage across load resistor 174 is flat. During the positive half cycles of the sine wave, the voltage across load resistor 174 falls off as shown in FIG. 4B. A third order pulse shaping network 176 is connected across the load resistor 174 and includes inductor 178, capacitor 180, and capacitor 182, in series; a pair of series-connected resistors 184, 186 across capacitor 182. The steep leading edges of the approximately rectangular wave across load resistor 174 are differentiated by capacitor 180;

the length of the differentiation pulses 188 shown in FIG. 4C is determined by the relationship of capacitor 180, capacitor 182, and the resistance 184, 186 across capacitor 182. The pulse shaping network 176, particularly the three reactive elements, can be readily designed to provide pulses that have the predetermined number of successive harmonics, e.g. 12, with maximum amplitude deviation of about 3db and wherein the succeeding harmonics are of negligible amplitude compared to the selected harmonics. It is important to eliminate any harmonics higher than the twelfth in order to prevent any spurious frequencies in the synthesizer which also can cause false lock. For 1MHz through 12MHz, excellent results were obtained in the radio set using the following components:

| | |
|---|---|
| Resistor 174 | 2.7K |
| Resistor 184 | 330 ohms |
| Resistor 186 | 220 ohms |
| Inductor 178 | 10 microhenries |
| Capacitor 180 | 36 picofarads |
| Capacitor 182 | 15 picofarads |
| Transistor 170 | 2N3251A |

A series of raised cosine pulses, having peak amplitude A, repetition angular frequency $\omega$ and half-value width $\phi$ has this spectrum:

$$f(\omega t) = \frac{A\phi}{2\pi} - A\pi \sum_{n=1}^{\infty} \frac{\sin n\phi}{n((n\phi)^2 - \pi^2)} \cos n\omega t$$

Decision is made on the number of harmonics. If the 12th harmonic should be 3dB below the first harmonic, then $\phi$ is found to be $\phi = 11°$, or $\tau = 11/360 \cdot 1\mu s$ (microsecond) $= 30.6\mu s$ (nanosecond), the pulse width desired. The thirtieth (unwanted) harmonic is then 28dB attenuated with respect to the first harmonic.

FIG. 4D illustrates the output waveform 190 obtained at terminals **126*a* and 126*b* of the mixer, having periodic bursts at the frequency of the VFO. Each half of the envelope of the waveform 190 is similar to the waveform shown in FIG. 4C.**

It should be understood, of course, that the foregoing disclosure relates to only a preferred embodiment of the inventive process and that numerous modifications or alterations may be made without departing from the spirit and scope of the invention as set forth in the appended claims.

What is claimed is:

1. A mixer comprising:

means for delivering a single frequency from within a predetermined band, conversion means operable on received sinusoidal energy for delivering periodic pulses that contain a fundamental frequency and a predetermined number of successive harmonics, that have maximum amplitude deviation on the order of 3db within a combined bandwidth slightly greater than one-half said predetermined band harmonics outside the bandwidth being attenuated, means for mixing single frequency energy delivered by said first recited means and said periodic pulses and providing an output frequency band of bandwidth numerically less than said fundamental frequency and centered at the center of said predetermined band.

2. A mixer as defined in claim 1 wherein said means for mixing includes a Class A balanced transistor amplifier, output means coupled to the collectors of the transistors of said amplifier, said means for delivering a single frequency being coupled to the bases of the transistors of said amplifier, and wherein said conversion means for delivering periodic pulses includes a normally nonconducting transistor switch means with its collector and emitter in series with the emitters of the transistors of said amplifier, said transistor switch means being normally nonconductive, said means for delivering the periodic pulses further including means operable to convert an input sine wave at the fundamental frequency to said periodic pulses that turn on said transistor switch means.

3. A mixer as defined in claim 1 wherein said conversion means for delivering the periodic pulses includes means operable in response to a sine wave input at said fundamental frequency to provide an approximately rectangular wave of the same period and with one steep side, and a third order pulse shaping network coupled to said means that provides the approximately rectangular wave to provide, in response thereto, said periodic pulses.

4. A mixer as defined in claim 3 wherein said third order pulse shaping network includes an inductor and two capacitors, in series, connected across the output of the means providing the rectangular wave, and resistance means connected across that one of the two capacitors remote from said inductor.

5. A mixer as defined in claim 2 wherein said means for delivering the periodic pulses includes means operable to convert a sine wave input at the frequency of said fundamental to an approximately rectangular wave operable to convert the rectangular wave to said periodic pulses, said third order pulse shaping network including an inductor and two capacitors, in series, connected across the output of said means providing the rectangular wave, and resistance means connected across that one of the two capacitors remote from said inductor.

6. A mixer as defined in claim 5 wherein said means operable to convert a sine wave input to an approximately rectangular wave includes a PNP transistor, a load resistor in series with the collector for developing the approximately rectangular wave, and a diode having its anode connected to the base of said PNP transistor and its cathode connected to the emitter of said PNP transistor.

* * * * *